(12) United States Patent
Sadhu et al.

(10) Patent No.: US 11,063,572 B2
(45) Date of Patent: Jul. 13, 2021

(54) POLARITY PATTERNED PIEZOELECTRIC FILM

(71) Applicant: Qorvo US, Inc., Greensboro, NC (US)

(72) Inventors: Jyothi Swaroop Sadhu, Apopka, FL (US); Maria Wang, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 793 days.

(21) Appl. No.: 15/843,863

(22) Filed: Dec. 15, 2017

(65) Prior Publication Data

US 2018/0175821 A1 Jun. 21, 2018

Related U.S. Application Data

(60) Provisional application No. 62/434,847, filed on Dec. 15, 2016.

(51) Int. Cl.
*H03H 9/02* (2006.01)
*H03H 3/02* (2006.01)

(52) U.S. Cl.
CPC .......... *H03H 9/0211* (2013.01); *H03H 3/02* (2013.01); *H03H 9/02015* (2013.01); *H03H 2003/023* (2013.01); *H03H 2003/025* (2013.01)

(58) Field of Classification Search
CPC .... H03H 9/0211; H03H 9/02015; H03H 9/02; H03H 9/02007; H03H 9/171

USPC .......................................... 310/326, 330–332
See application file for complete search history.

(56) References Cited

U.S. PATENT DOCUMENTS

2003/0205948 A1* 11/2003 Lin ........................ H03H 9/542
310/312

OTHER PUBLICATIONS

Larson, J.D., et al., "Characterization of Reversed c-axis AlN Thin Films," International Ultrasonics Symposium Proceedings, Oct. 2010, San Diego, California, IEEE, pp. 1054-1059.

* cited by examiner

*Primary Examiner* — Derek J Rosenau
(74) *Attorney, Agent, or Firm* — Withrow & Terranova, P.L.L.C.

(57) ABSTRACT

A piezoelectric device includes a foundation structure and a plurality of metal islands distributed over a first area of a top surface of the foundation structure. A piezoelectric film resides over the foundation structure and is formed from a piezoelectric material. The piezoelectric film has a non-piezoelectric portion over the first area and a piezoelectric portion over a second area of the top surface of the foundation structure. Within the non-piezoelectric portion, the piezoelectric film is polarity patterned to have pillars and a mesh. The pillars of the piezoelectric material have a first polar orientation residing over corresponding ones of the plurality of metal islands. The mesh of the piezoelectric material has a second polar orientation, which is opposite that of the first polar orientation, and surrounds the pillars. In one embodiment, the metal islands are self-assembled islands.

18 Claims, 19 Drawing Sheets

POLARITY PATTERNED PIEZOELECTRIC FILM

RELATED APPLICATIONS

This application claims the benefit of provisional patent application Ser. No. 62/434,847, filed Dec. 15, 2016, the disclosure of which is hereby incorporated herein by reference in its entirety.

FIELD OF THE DISCLOSURE

The present disclosure relates to piezoelectric films, and in particular to piezoelectric films that have a portion that is polarity patterned.

BACKGROUND

Acoustic resonators, and particularly Bulk Acoustic Wave (BAW) resonators, are used in many high frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

A piezoelectric device includes a foundation structure and a plurality of metal islands distributed over a first area of a top surface of the foundation structure. A piezoelectric film resides over the foundation structure and is formed from a piezoelectric material. The piezoelectric film has a non-piezoelectric portion over the first area and a piezoelectric portion over a second area of the top surface of the foundation structure. Within the non-piezoelectric portion, the piezoelectric film is polarity patterned to have pillars and a mesh. The pillars of the piezoelectric material have a first polar orientation residing over corresponding ones of the plurality of metal islands. The mesh of the piezoelectric material has a second polar orientation, which is opposite that of the first polar orientation, and surrounds the pillars. In one embodiment, the metal islands are self-assembled islands.

The metal islands may be provided over the foundation structure such that there are intervening piezoelectric base layers between the metal islands and the foundation structure. In other embodiments, the metal islands may be formed on a piezoelectric base layer that is not polarity patterned, wherein the base layer resides between the metal islands and the foundation structure. When the material ratio of the pillars to the mesh is approximately 1:1, the electromechanical coupling coefficient k of the non-piezoelectric portion of the piezoelectric film is near zero.

A method for fabricating the above device includes providing a foundation structure, and depositing a first metal over a first area of a top surface of the foundation structure such that a plurality of metal islands self-assemble in a distributed manner over the first area of the top surface of the foundation structure. The method also includes depositing a piezoelectric film over the first area and the plurality of metal islands. Over the first area, the piezoelectric film is polarity patterned and includes pillars and a mesh. The pillars of the piezoelectric material have a first polar orientation residing over corresponding ones of the plurality of metal islands. The mesh of the piezoelectric material has a second polar orientation, which is opposite that of the first polar orientation, and surrounding the pillars. As noted above, a base layer of the piezoelectric material may be provided between the metal islands and the foundation structure, wherein the metal islands reside over the base layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figures 19, 20:
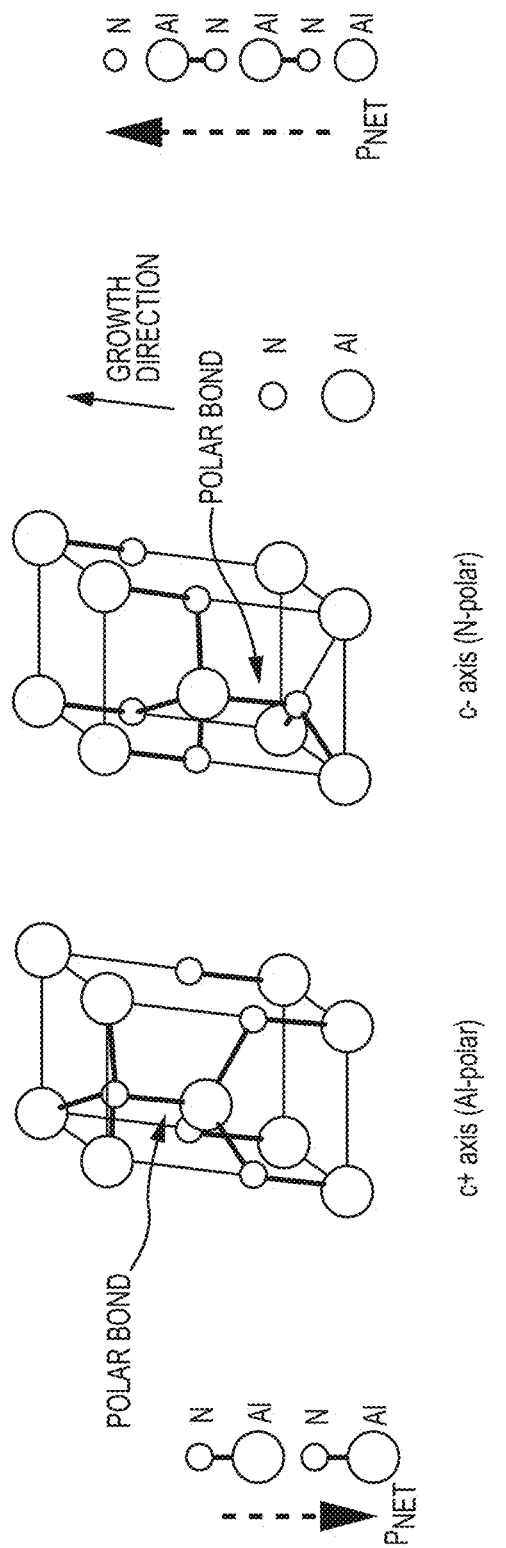

FIGS. 19 and 20 graphically illustrate the different polar orientations of aluminum nitride.

Figure 21:
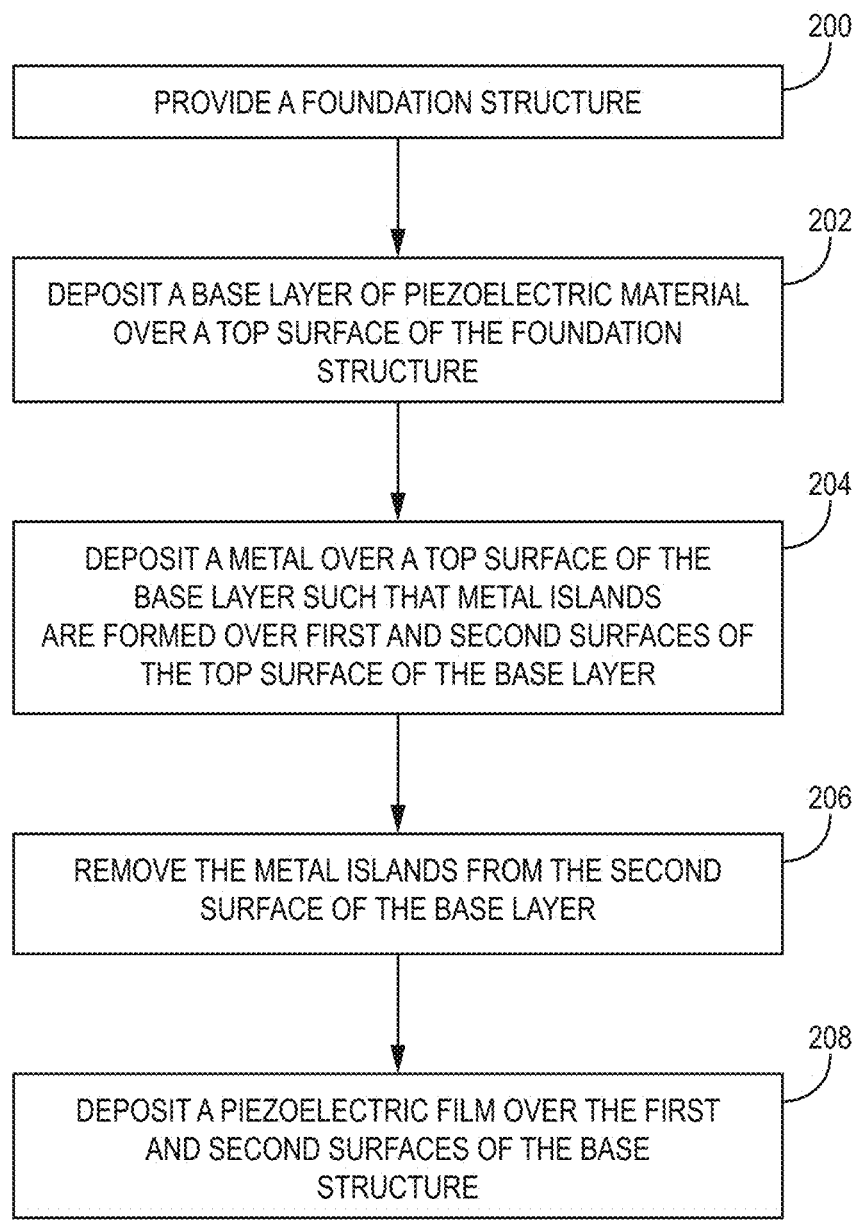

FIG. 21 is a method of fabricating a piezoelectric device according to a second embodiment.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a unique piezoelectric device and film. The piezoelectric device includes a foundation structure and a plurality of metal islands distributed over a first area of a top surface of the foundation structure. A piezoelectric film resides over the foundation structure and is formed from a piezoelectric material. The piezoelectric film has a non-piezoelectric portion over the first area and a piezoelectric portion over a second area of the top surface of the foundation structure. Within the non-piezoelectric portion, the piezoelectric film is polarity patterned to have pillars and a mesh. The pillars of the piezoelectric material have a first polar orientation residing over corresponding ones of the plurality of metal islands. The mesh of the piezoelectric material has a second polar orientation, which is opposite that of the first polar orientation, and surrounds the pillars. In one embodiment, the metal islands are self-assembled islands.

The metal islands may be provided over the foundation structure such that there are intervening piezoelectric base layers between the metal islands and the foundation structure. In other embodiments, the metal islands may be formed on a piezoelectric base layer that is not polarity patterned wherein the base layer resides between the metal islands and the foundation structure. When the material ratio of the pillars to the mesh is approximately 1:1, the electromechanical coupling coefficient k of the non-piezoelectric portion of the piezoelectric film is near zero.

A method for fabricating the above device includes providing a foundation structure, and depositing a first metal over a first area of a top surface of the foundation structure such that a plurality of metal islands self-assemble in a distributed manner over the first area of the top surface of the foundation structure. The method also includes depositing a piezoelectric film over the first area and the plurality of metal islands. Over the first area, the piezoelectric film is polarity patterned and includes pillars and a mesh. The pillars of the piezoelectric material have a first polar orientation residing over corresponding ones of the plurality of metal islands. The mesh of the piezoelectric material has a second polar orientation, which is opposite that of the first polar orientation, and surrounds the pillars. As noted above, a base layer of the piezoelectric material may be provided between the metal islands and the foundation structure, wherein the metal islands reside over the base layer.

Figure 1:
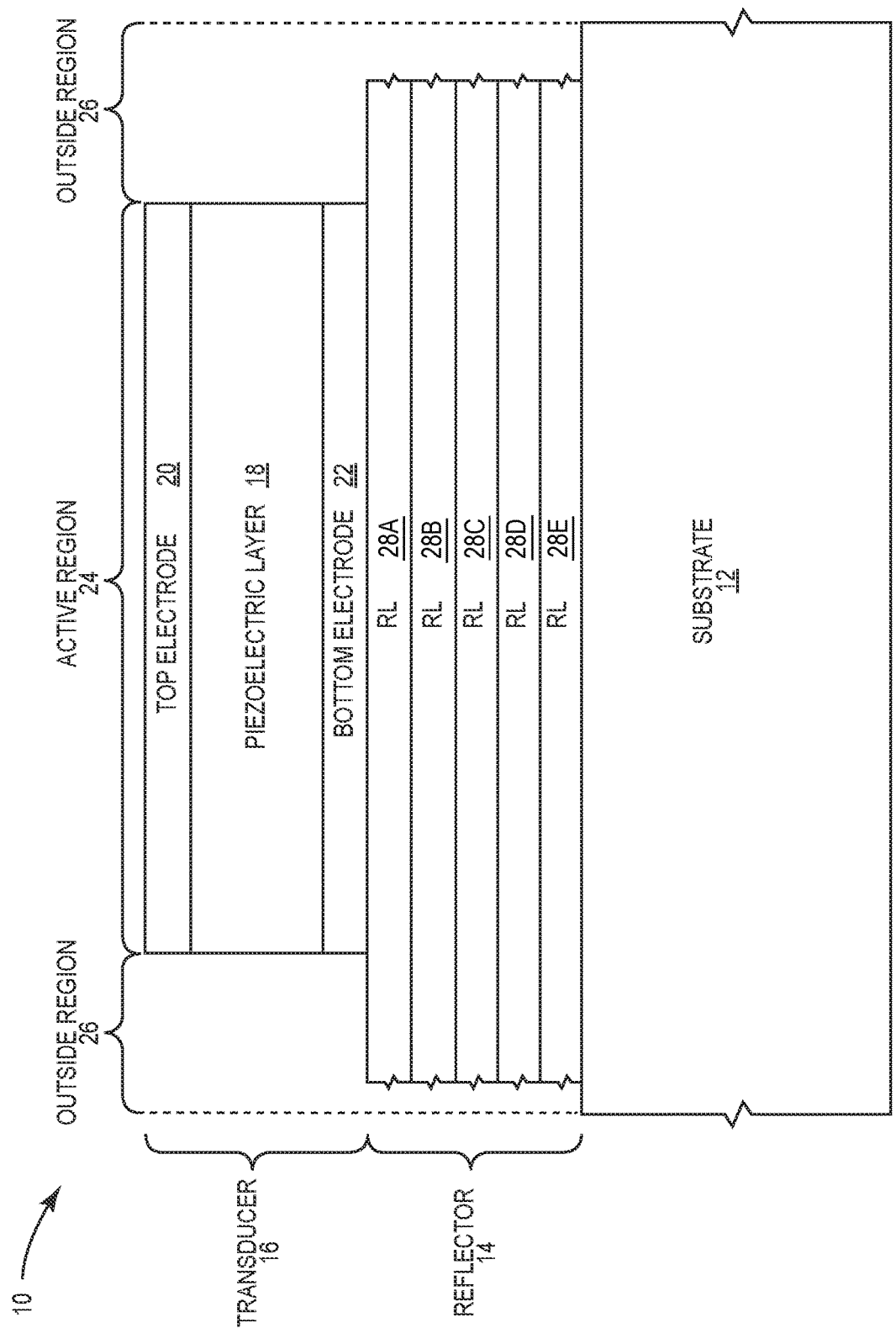
FIG. 1 illustrates a conventional Bulk Acoustic Wave (BAW) resonator.

The piezoelectric device may be implemented in a variety of devices, such as a BAW resonator. Prior to delving into the details of the unique piezoelectric film, and overview of the a BAW resonator and if operation is described. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28A through 28E, which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another.

Figure 2:
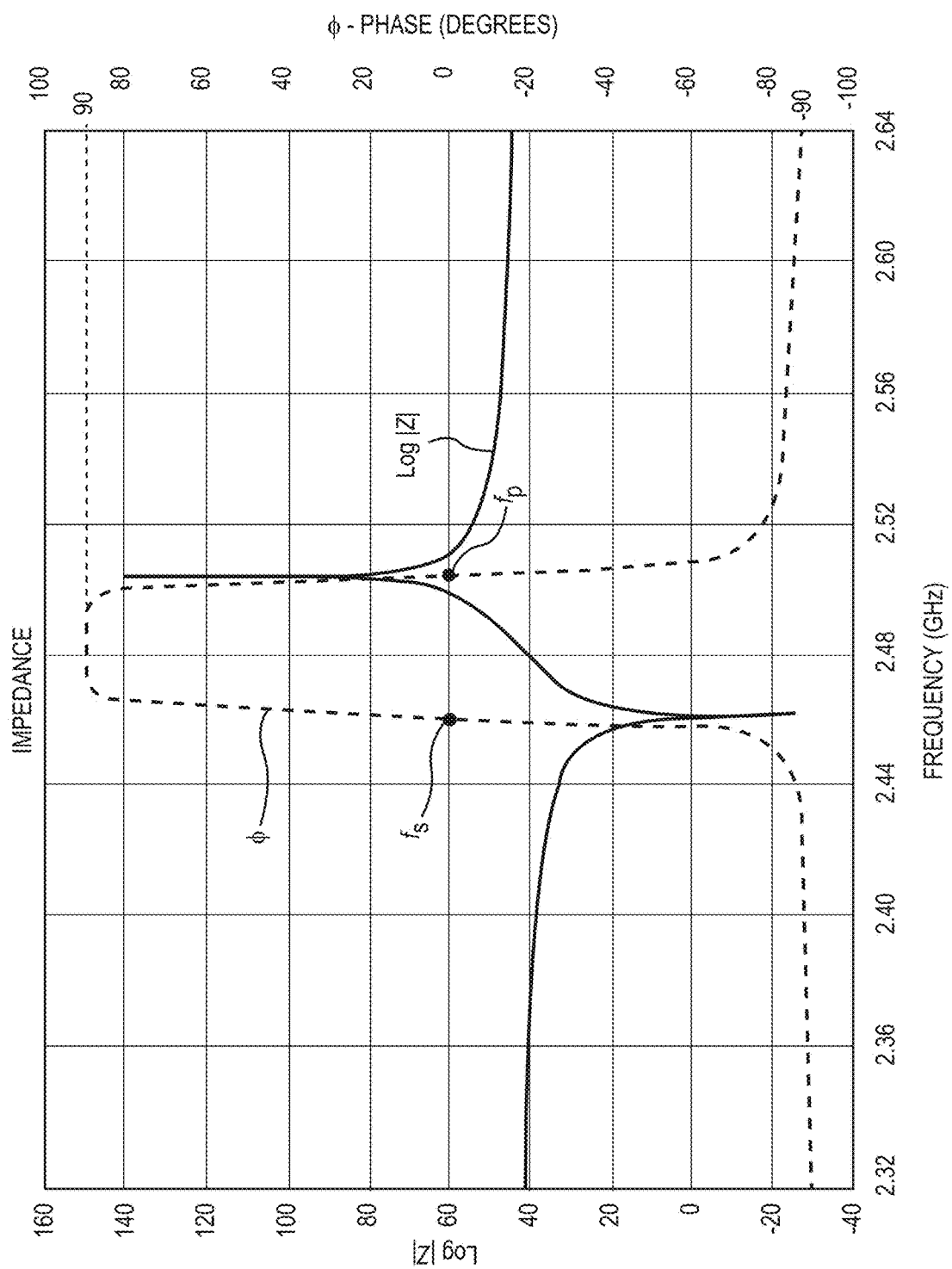
FIG. 2 is a graph of the magnitude and phase of impedance over frequency responses as a function of frequency for an ideal BAW resonator.

The magnitude (Z) and phase (φ) of the electrical impedance as a function of the frequency for a relatively ideal BAW resonator 10 is provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20 and 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near zero, resistance at the series resonance frequency (fs), and a very high resistance at the parallel resonance frequency (fp). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figure 3:
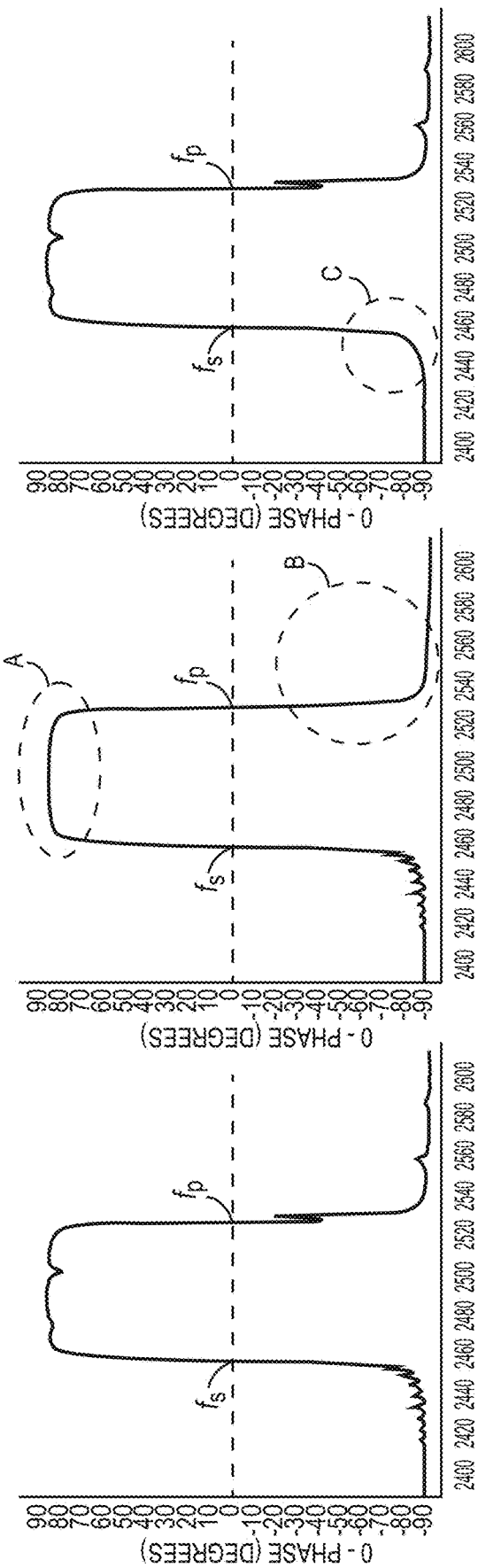
FIGS. 3A-3C are graphs of phase responses for various BAW resonator configurations.

Unfortunately, the phase (φ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
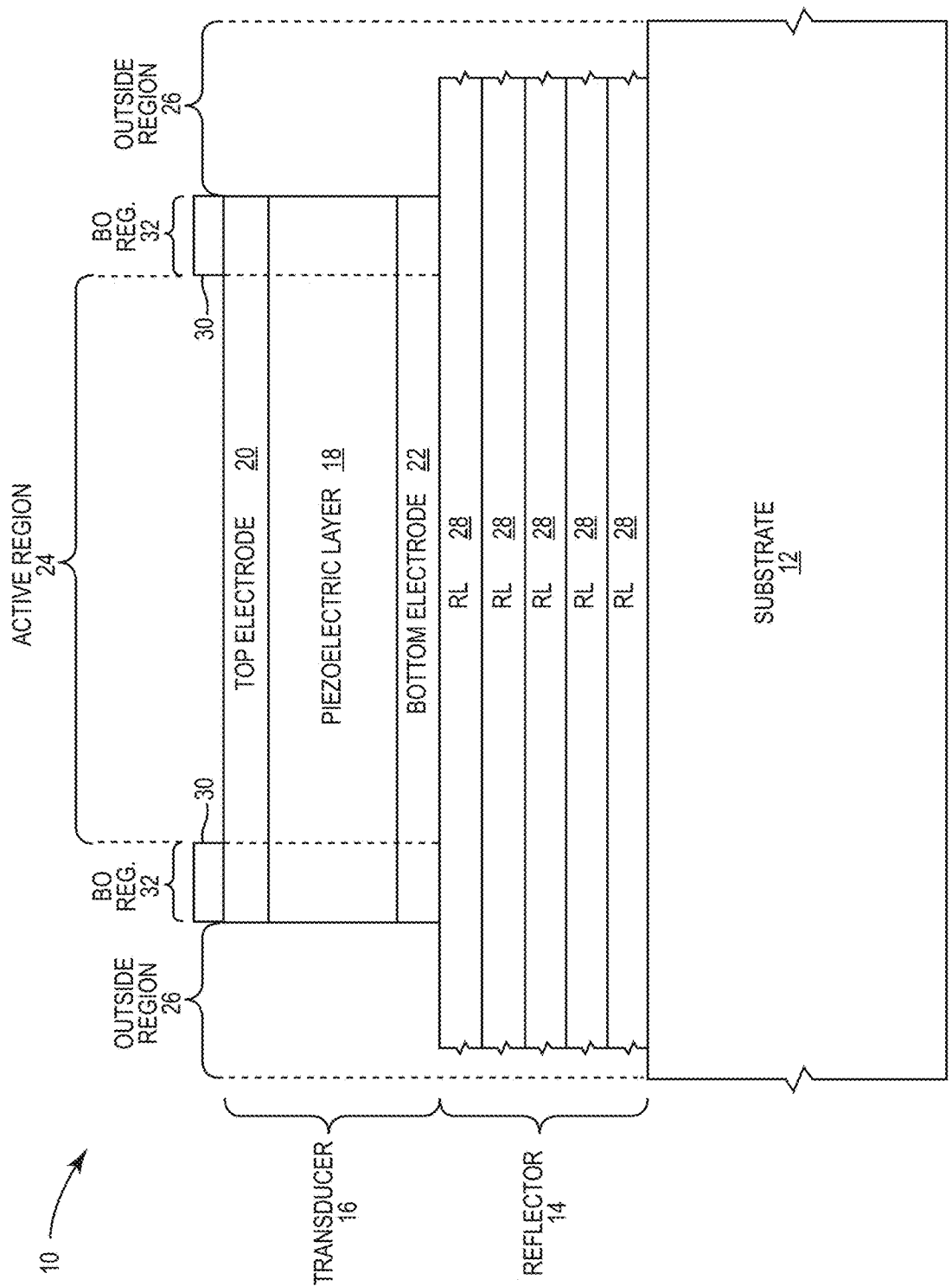
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency fp, and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonance frequency (fs). As such, the typical BAW resonator 10 employs both apodization and the BO ring 30.

Figure 5A:
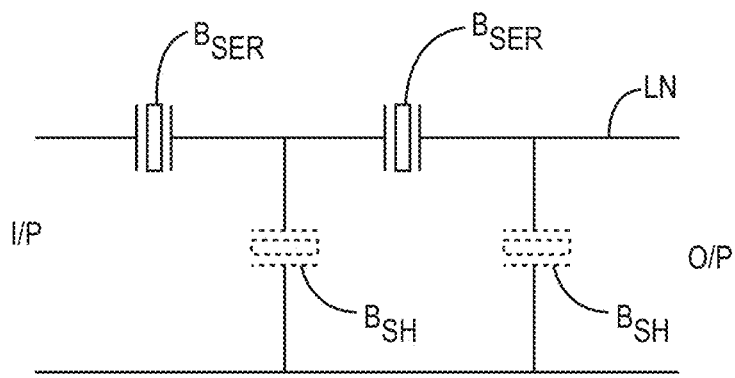
FIG. 5A is a schematic of a conventional ladder network.
Figure 5B:
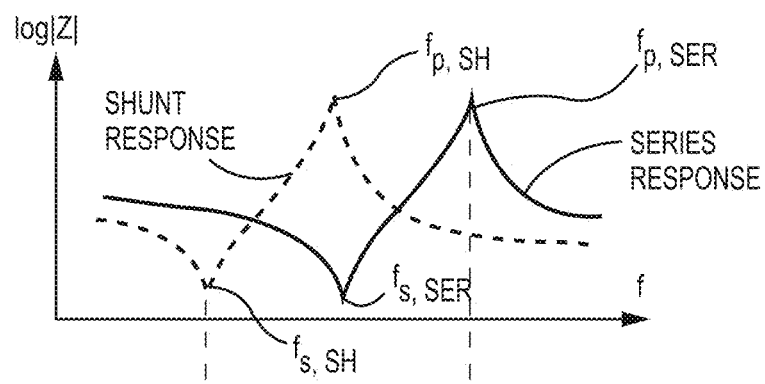
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network LN is illustrated in FIG. 5A. The ladder network LN includes two series resonators BSER and two shunt resonators BSH, which are arranged in a traditional latter configuration. Typically, the series resonators BSER have the same or similar first frequency response, and the shunt resonators BSH have the same or similar second frequency response, which is different than the first frequency response, as shown in FIG. 5B. In many applications, the shunt resonators BSH detuned version of the series resonators BSER. As a result, the frequency responses for the series resonators BSER and the shunt resonators BSH are generally very similar, yet shifted relative to one another such that the parallel resonance frequency (fP,SH), of the shunt resonators approximates the series resonance frequency (fS,SER), of the series resonators BSER. Note that the series resonance frequency (fS,SH) of the shunt resonators BSH is less than the series resonance frequency (fS,SER) of the series resonators BSER. The parallel resonance frequency (fP,SH) of the shunt resonators BSH is less than the parallel resonance frequency (fP,SER) of the series resonators BSER.

Figure 5C:
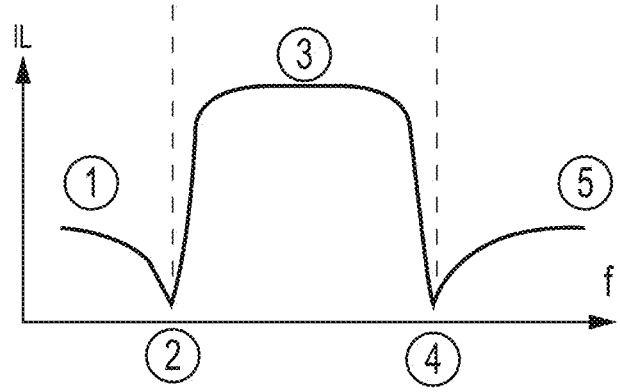

FIG. 5C is associated with FIG. 5B and illustrates the response of the ladder network LN. The series resonance frequency (fS,SH) of the shunt resonators BSH corresponds to the low side of the passband's skirt (phase 2), and the parallel resonance frequency (fP,SER) of the series resonators BSER corresponds to the high side of the passband's skirt (phase 4). The substantially aligned series resonance frequency (fS,SER) of the series resonators BSER and the parallel resonance frequency (fP,SH) of the shunt resonators BSH fall within the passband. FIGS. 6A through 6E provide circuit equivalents for the five phases of the response of the ladder network LN. During the first phase (phase 1, FIGS. 5C, 6A), the ladder network LN functions to attenuate the input signal. As the series resonance frequency (fS,SH) of the shunt resonators BSH is approached, the impedance of the shunt resonators BSH drops precipitously, such that the shunt resonators BSH essentially provide a short to ground at the series resonance frequency (fS,SH) of the shunt resonators (phase 2, FIGS. 5C, 6B). At the series resonance frequency (fS,SH) of the shunt resonators BSH (phase 2), the input signal is essentially blocked from the output of the ladder network LN.

Figure 6A:
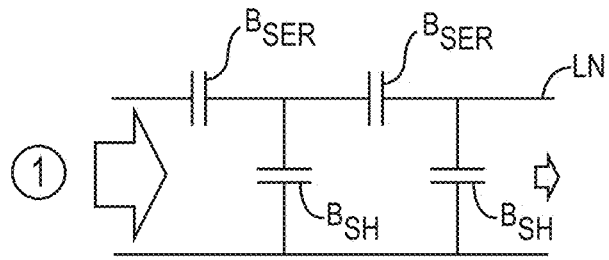
FIGS. 6A-6E are circuit equivalents for the ladder network of FIG. 5A at the frequency points 1, 2, 3, 4, and 5, which are identified in FIG. 5C.
Figure 6B:
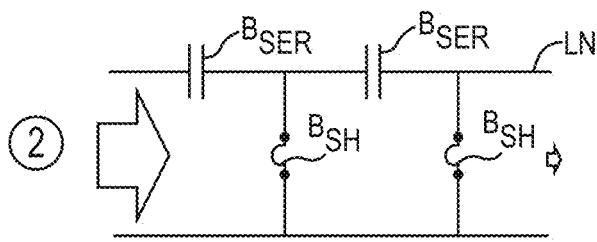
Figure 6C:
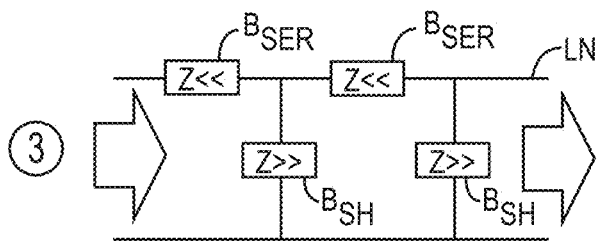
Figure 6D:
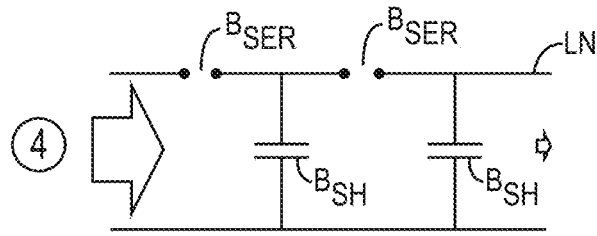
Figure 6E:
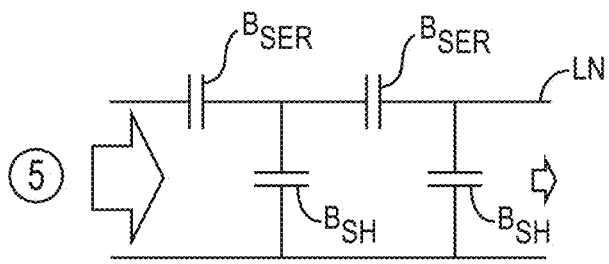

Between the series resonance frequency (fS,SH) of the shunt resonators BSH and the parallel resonance frequency (fP,SER) of the series resonators BSER, which corresponds to the passband, the input signal is passed to the output with relatively little or no attenuation (phase 3, FIGS. 5C, 6C). Within the passband, the series resonators BSER present relatively low impedance, while the shunt resonators BSH present a relatively high impedance, wherein the combination of the two leads to a flat passband was steep low and high-side skirts. As the parallel resonance frequency (fP, SER) of the series resonators BSER is approached, the impedance of the series resonators BSER becomes very high, such that the series resonators BSER essentially present themselves as an open at the parallel resonance frequency (fP,SER) of the series resonators (phase 4, FIGS. 5C, 6D). At the parallel resonance frequency (fP,SER) of the series resonators BSER (phase 4), the input signal is again essentially blocked from the output of the ladder network LN. During the final phase (phase 5, FIGS. 5C, 6E), the ladder network LN functions to attenuate the input signal, in a similar fashion to that provided in phase 1. As the parallel resonance frequency (fP,SER) of the series resonators BSER is passed, the impedance of the series resonators BSER decreases, and the impedance of the shunt resonators BSH normalize. Thus, the ladder network LN functions to provide a high Q passband between the series resonance frequency (fS,SH) of the shunt resonators BSH and the parallel resonance frequency (fP,SER) of the series resonators BSER. The ladder network LN provides extremely high attenuation at both the series resonance frequency (fS,SH) of the shunt resonators BSH and the parallel resonance frequency (fP, SER) of the series resonators. The ladder network LN provides good attenuation below the series resonance frequency (fS,SH) of the shunt resonators BSH and above the parallel resonance frequency (fP,SER) of the series resonators BSER.

In a single modern communication system, such as a mobile telephone, numerous filters requiring passbands of different bandwidths and centered at different frequencies. The center frequencies of filters that employ BAW resonators 10 are primarily governed by the thicknesses of the various layers of the transducer 16, and in particular, the thickness of the piezoelectric layer 18. The passband bandwidths and shapes of the band edges of the filters are primarily governed by the electromechanical coupling coefficient k of the piezoelectric layer 18. An electromechanical coupling coefficient k is the measure of the effectiveness of the piezoelectric layer in converting electrical energy to mechanical energy, and vice versa. Different piezoelectric materials or material compositions will generally have different electromechanical coupling coefficients k.

For passbands having bandwidths less than 100 MHz, aluminum nitride (AlN) is a common choice for the piezoelectric layer 18. For passband having bandwidth greater than 100 MHz, newer piezoelectric materials that provide an increased electromechanical coupling coefficient k are being employed. These newer piezoelectric materials include, but are not limited to, aluminum nitride that has been doped with one or more transition metals, such as scandium (Sc), yttrium (Y), (Mg), zirconium (Zr), and the like, alone or in combination with other materials such as erbium (Er), magnesium (Mg) and the like. Exemplary piezoelectric materials include, but are not limited to ScAlN, YAlN, [Mg][Zr]AlN, [Sc][Er]AlN, and the like.

Unfortunately, each of these piezoelectric materials has a fairly specific electromechanical coupling factor k. As a result, designers currently have to pick a particular piezoelectric material, and then design the rest of the BAW resonator 10 and the filters that employ the BAW resonator 10 around the electromechanical coupling factor k of the chosen piezoelectric material. In other words, the choice of the piezoelectric material for the piezoelectric layer 18 restricts the electromechanical coupling factor k, and as such, ultimately limits the ability of the designer to optimize the performance of the overall filter design. Further, designers would benefit from a technique for providing electromechanical coupling in certain areas of the piezoelectric layer 18 and providing essentially zero electromechanical coupling in other areas of the piezoelectric layer 18. For example, one would like to provide electromechanical coupling at a desired level in the active regions 24 of the BAW resonators 10 and little or no electromechanical coupling in the outside regions 26 and/or border regions 32.

The electromechanical coupling factor of a material is a function of the piezoelectric properties of the material. As such, non-piezoelectric materials will exhibit little or no electromechanical coupling, and thus have an electromechanical coupling factor k of zero or approaching zero. The piezoelectric materials will exhibit an electromechanical coupling factor k based at least on part on the piezoelectric properties of the material.

The following describes a technique for providing both piezoelectric and non-piezoelectric areas in a piezoelectric film. As described above, multiple BAW resonators 10 are often used in conjunction to form ladder networks 40 and the like. In many instances, the multiple BAW resonators 10 that are used to form the ladder networks 40 are integrated on a single die, wherein the transducers 16 of the different BAW resonators 10 share a common substrate 12, reflector 14, and the like. Further, the piezoelectric layers 18, top electrodes 20, and bottom electrodes 22 are individually formed from common material layers through appropriate deposition and etching processes.

Figure 7:
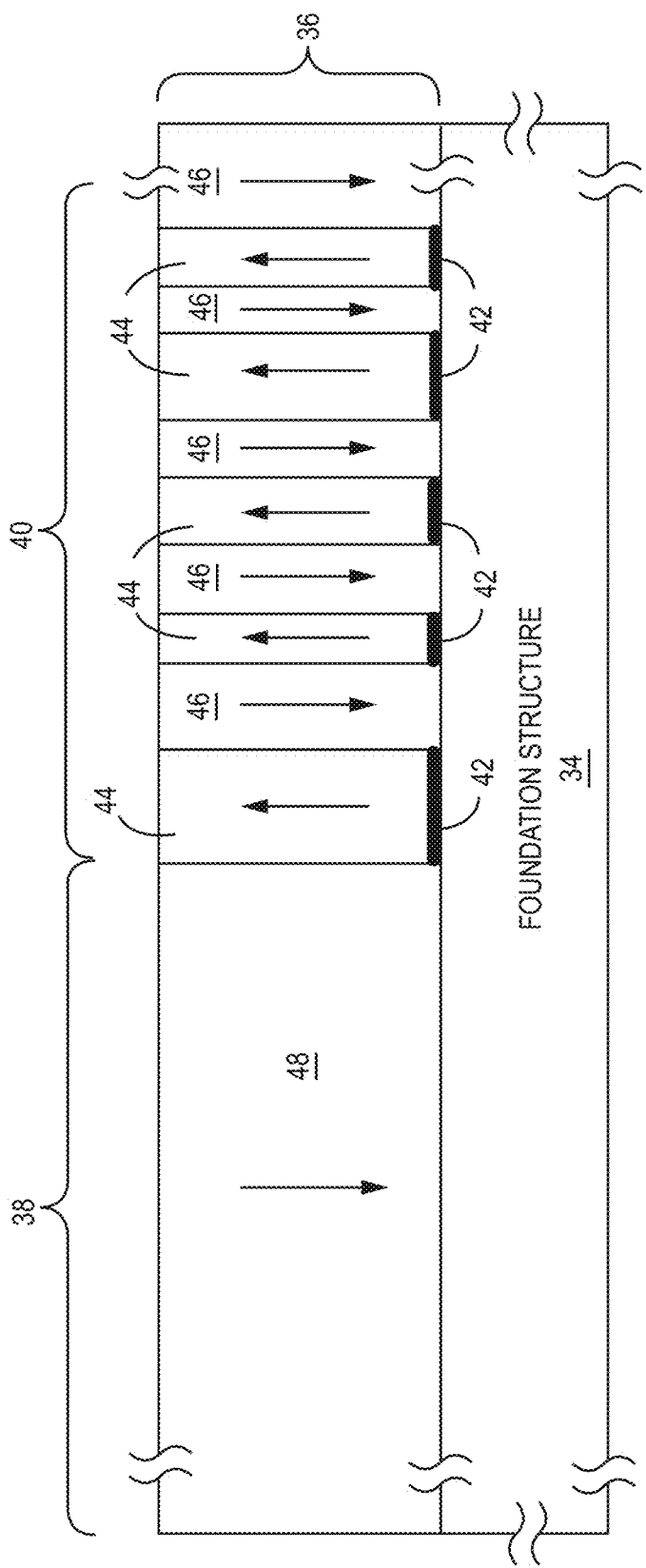
FIG. 7 illustrates a piezoelectric device that provides a piezoelectric film that has both piezoelectric and non-piezoelectric portions according to a first embodiment of the disclosure.

With reference to FIG. 7, the present disclosure relates to a piezoelectric film 36 that is formed over a foundation structure 34 and from a piezoelectric material. The foundation structure 34 may represent any portion or portions of a resonator, such as a BAW resonator 10, or other device that employs piezoelectric materials. The piezoelectric film 36 is formed from what is normally a piezoelectric material and at one or more piezoelectric portions 38 and non-piezoelectric portions 40. The non-piezoelectric portions 40 are referred to herein as polarity patterned. The polarity patterned, non-piezoelectric portions 40 are formed over a plurality of self-assembled or otherwise formed metal islands 42, which are distributed over a first portion of a top surface of the foundation structure 34.

Below the non-piezoelectric portions 40, those areas of the top surface of the foundation structure 34 that are not covered by the metal islands 42 define an "uncovered" surface. The piezoelectric film 36 is formed using an appropriate deposition process or the like over the metal islands 42 as well as the remaining uncovered surface of the foundation structure 34. Those portions of the piezoelectric film 36 over the metal islands 42 provide pillars 44 that have a first polar orientation, which is identified by the upward pointing arrows. Those portions of the piezoelectric film 36 over the uncovered surface of the foundation structure 34 define a mesh 46 that effectively surrounds the pillars 44 and the metal islands 42 from which the pillars 44 extend. The mesh 46 has a second polar orientation, which is essentially opposite that of the first polar orientation and identified by the downward pointing arrows. Since the piezoelectric material is the same for the pillars 44 and the mesh 46, but the polar orientations are essentially opposite, the polarities of the respective molecular structures substantially cancel out one another. The result is that the electromechanical coupling coefficient k of the non-piezoelectric portions 40 of the piezoelectric film is near zero, which is defined herein as an electromechanical coupling coefficient k of less than 0.01.

As discussed in greater detail below, the presence of the metal islands 42 causes the inversion of the polar orientation of the piezoelectric material that grows over and above the metal islands 42. The material that grows over and above the metal islands corresponds directly to the pillars 44. In the case of a group III-V piezoelectric material, such as aluminum nitride, the aluminum nitride naturally grows with the second orientation (nitrogen polar/N-polar) when not grown over aluminum. When grown over the metal islands 42, which are formed of aluminum, the aluminum naturally grows in the first orientation (aluminum polar/Al-polar), which is opposite the second orientation (aluminum polar/Al-polar).

Within the piezoelectric portions 38 of the piezoelectric film 36, a uniform portion 48 (i.e. not polarity patterned) of the piezoelectric material is provided. As such, the electromechanical coupling coefficient k of the piezoelectric portions 38 of the piezoelectric film 36 may range from 0.04 (4%) to 0.10 (10%), depending on the piezoelectric material. Notably, the same piezoelectric material is used throughout the piezoelectric and non-piezoelectric portions 38, 40. As a result, the polar orientations of the mesh 46 and the uniform portion 48 of the piezoelectric portions 38 are the same as one another, as indicated by the downward pointing arrows, and are opposite that of the pillars 44, as indicated by the upward pointing arrows.

Figure 8:
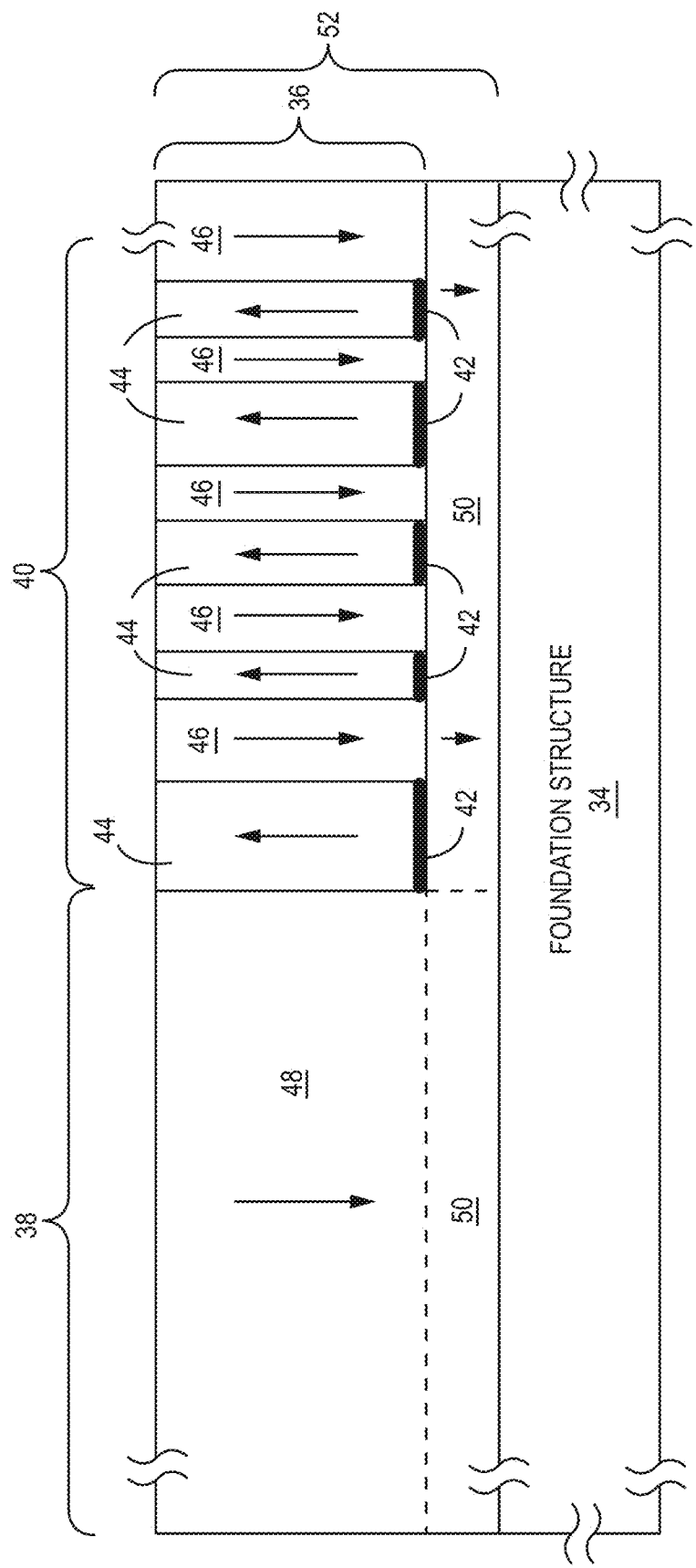
FIG. 8 illustrates a piezoelectric device that includes both piezoelectric and non-piezoelectric portions according to a second embodiment of the disclosure.

In an alternative embodiment illustrated in FIG. 8, the piezoelectric film 36 may reside over a base layer 50, which is formed from the same or different piezoelectric material as the piezoelectric film 36. The base layer 50 is not polarity patterned. The portion of the base layer 50 that resides below the piezoelectric portion 38 may be integrated with and formed in the same or different process step as the piezoelectric film 36. The metal islands 42 are formed on the top surface of the base layer 50. The portion of the base layer 50 beneath the non-piezoelectric portion 40 of the piezoelectric film 36 may be formed during a first deposition process, which is stopped to allow the metal islands 42 to be formed prior to depositing the non-piezoelectric portion 40 of the piezoelectric film 36. The polar orientation of the base layer 50 will correspond with that of the mesh 46 and the uniform portion 48 of the piezoelectric portions 38, as indicated by the downward pointing arrows, and will be opposite the polar orientation of the pillars 44, as indicated by the upward pointing arrows. In essence, the polar orientation in the piezoelectric material below the metal islands 42 is opposite of the piezoelectric material above the metal islands (i.e. the pillars 44). The combination of the piezoelectric film 36 and the base layer 50 is referred to herein as a hybrid piezoelectric structure 52.

Figure 9:
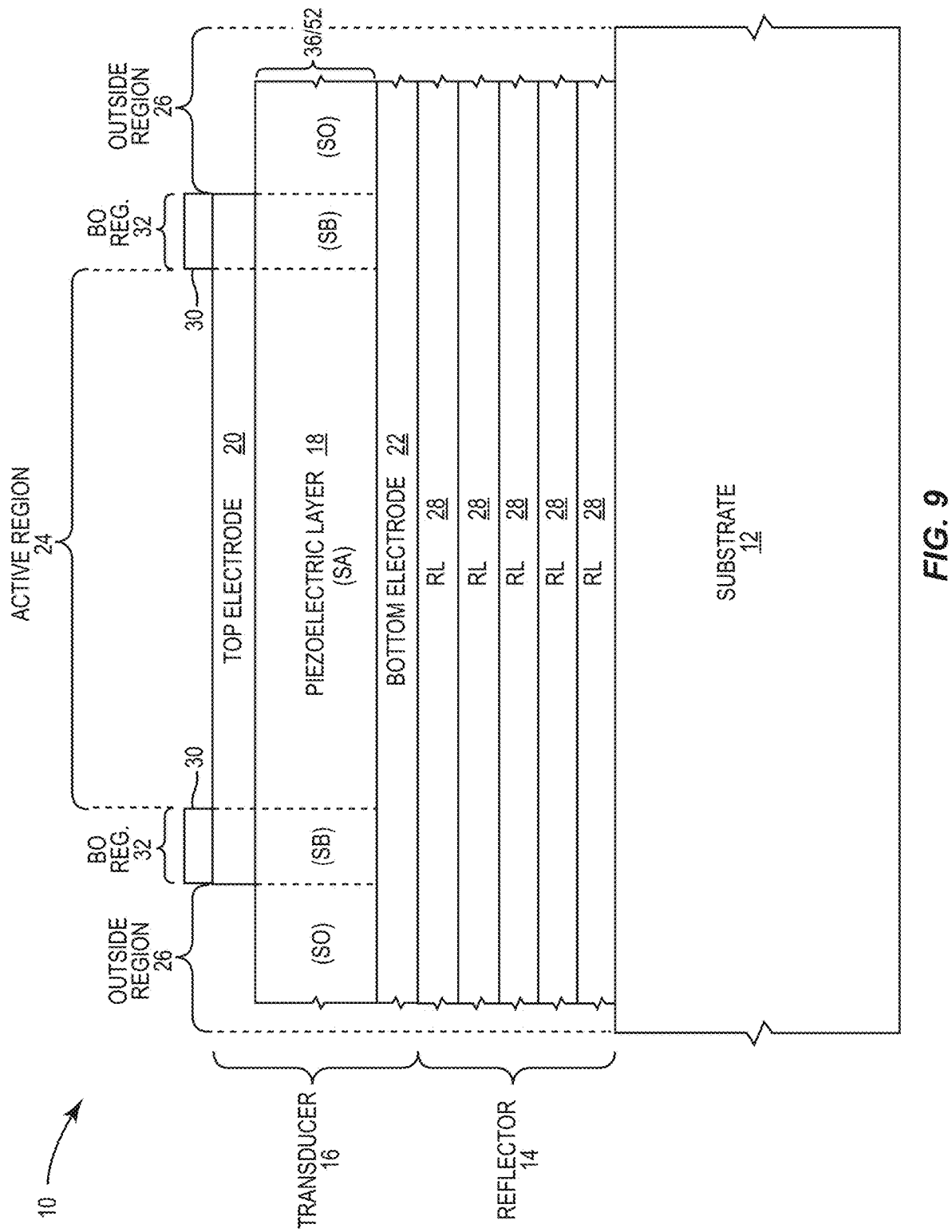
FIG. 9 illustrates a Bulk Acoustic Wave (BAW) resonator, which incorporates the piezoelectric film of either FIG. 7 or 8.

The piezoelectric film 36 or hybrid piezoelectric structure 52 may be employed in a BAW resonator 10, as illustrated in FIG. 9. In particular, the piezoelectric film 36 or hybrid piezoelectric structure 52 may be used, at least in part, to form the piezoelectric layer 18. As described above, the piezoelectric layer 18 may have portions that reside in the active region 24, the outside region 26, and a border region 32, which when provided, resides between the active region 24 and the outside region 26. The portion of the piezoelectric layer 18 within the active region 24 is referred to as the active portion SA, the portion of the piezoelectric layer 18 within the outside region 26 is referred to as the outside portion SO, and the portion of the piezoelectric layer 18 within the border region 32 is referred to as the border portion SB.

When the piezoelectric film 36 is provided without the base layer 50, the piezoelectric portion 38 of the piezoelectric film 36 is typically provided throughout most, if not all, of the active portion SA. Depending on the desires of the designer, either the piezoelectric portion 38 or the non-piezoelectric portion 40 of the piezoelectric film 36 is provided throughout most, if not all, of the border portion SB. In certain embodiments, the border portion SB may have both a piezoelectric portion 38 and a non-piezoelectric portion 40 of the piezoelectric film 36. The non-piezoelectric portion 40 of the piezoelectric film 36 is provided throughout most, if not all, of the outside portion SA, such that the electromechanical coupling coefficient k of the outer region SO is near zero.

When the base layer 50 is included such that the piezoelectric layer 18 is formed from the hybrid piezoelectric structure 52, the active portion SA may include a non-piezoelectric portion 40 of the piezoelectric film 36 above a portion of the base layer 50 (as illustrated in FIG. 8). By including a layer of the non-piezoelectric portion 40 of the piezoelectric film 36 and the piezoelectric base layer 50 in the active portion SA, the electromechanical coupling coefficient k in the active portion SA is decreased relative to the entirety of the active portion SA being filled with (non-polarity patterned) piezoelectric material. The extent of reduction in the electromechanical coupling coefficient k generally corresponds to the ratio of the thickness of the non-piezoelectric portion 40 to the thickness of the base layer 50. The thicker the non-piezoelectric portion 40 is relative to the base layer 50, the lower the electromechanical coupling coefficient k.

Depending on the desires of the designer, either the piezoelectric portion 38 or the non-piezoelectric portion 40 of the piezoelectric film 36 is provided throughout most, if not all, of the border portion SB. In certain embodiments, the border portion SB may have both a piezoelectric portion 38 and a non-piezoelectric portion 40 of the piezoelectric film 36. The non-piezoelectric portion 40 of the piezoelectric film 36 is generally provided throughout most, if not all, of the outside portion SA, such that the electromechanical coupling coefficient k of the outer region SO is near zero.

Figure 10:
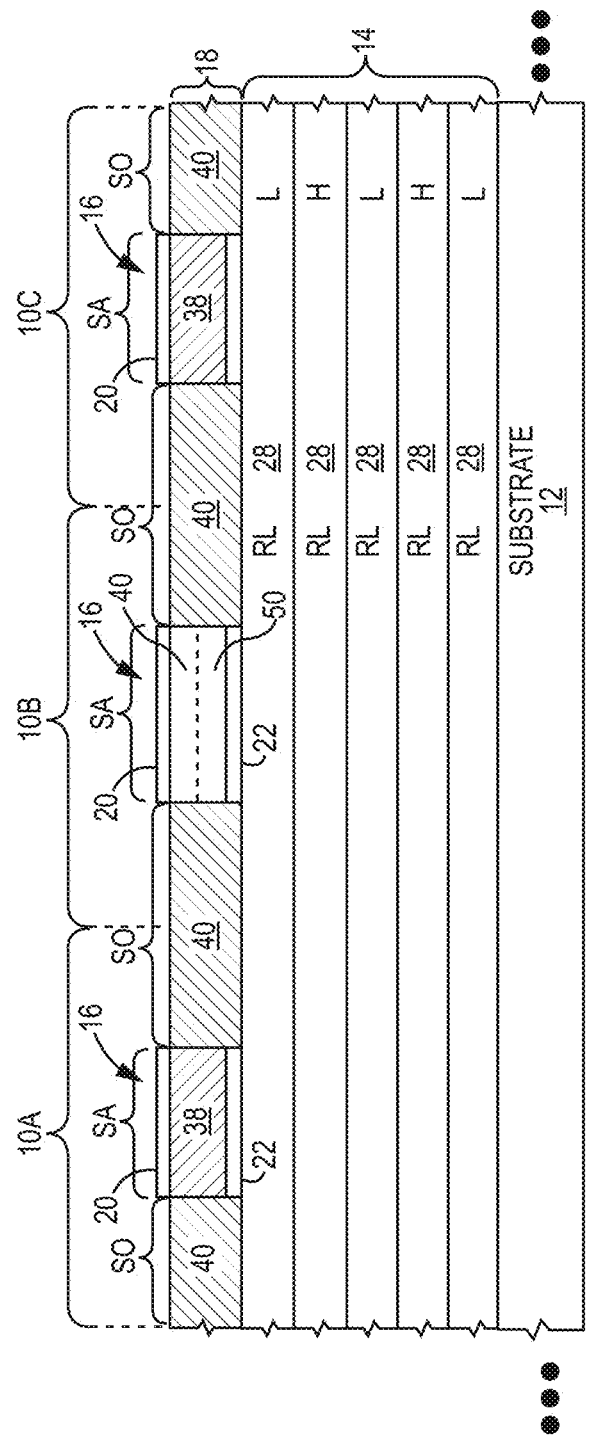
FIG. 10 illustrates multiple BAW resonators that are fabricated on a single die according to one embodiment of the disclosure.

As illustrated in FIG. 10, different BAW resonators 10A, 10B, 10C, which reside on a common die, may have different configurations for the piezoelectric layer 18. As illustrated, the outer regions SO of the piezoelectric layer 18 are formed from (polarity patterned) non-piezoelectric portions 40 of the piezoelectric layer 18. The active portions SA of the piezoelectric layer 18 of BAW resonators 10A, 10C are formed from (uniform) piezoelectric portions 38 of the piezoelectric layer 18. The active portions SA of the piezoelectric layer 18 of the BAW resonator 10B incorporate the hybrid piezoelectric structure 52 in that the active portion SA is formed from a purely piezoelectric base layer 50 below a (polarity pattered) non-piezoelectric portion 40. As a result, the electromechanical coupling coefficient k can vary as desired from one active portion SA of one BAW resonator 10A, 10B, 10C to another on the same die. Further, the outer portions SO between the various BAW resonators 10A, 10B, 10C may have an electromechanical coupling coefficient k of near zero, which enhances the performance of the BAW resonators 10A, 10B, 10C. The border portions SB are not shown for clarity, but may vary as described above.

The electromechanical coupling factor k is generally a unit-less value between 0 to 1, or when using percentages, between 0% to 100%. Normal aluminum nitride has an electromechanical coupling factor of around 6.50% (or 0.065). Baseline piezoelectric films have electromechanical coupling factors k ranging from 5.0% to 10.0%. With the current state of the art, scandium doping of aluminum nitride to form ScAlN films are used when the electromechanical coupling factor k exceeds 7% (or 0.07). For the polarity patterned non-piezoelectric portions 40 wherein the pillars 44 make up approximately 50% and the mesh 46 makes up approximately 50% (i.e. 47% to 53%) of the non-piezoelectric portions 40, the electromechanical coupling factor k is theoretically 0% (or 0.00). However, the split ratio of metal island coverage to mesh coverage does not have to be equal. For example, if the metal island coverage is between 30% and 70% (and the mesh coverage is between 30% and 70%), the electromechanical coupling factor k can range from 0% to 2.5% when aluminum is used for the metal islands 42 and aluminum nitride is used for the piezoelectric film 36.

Figures 11, 12:
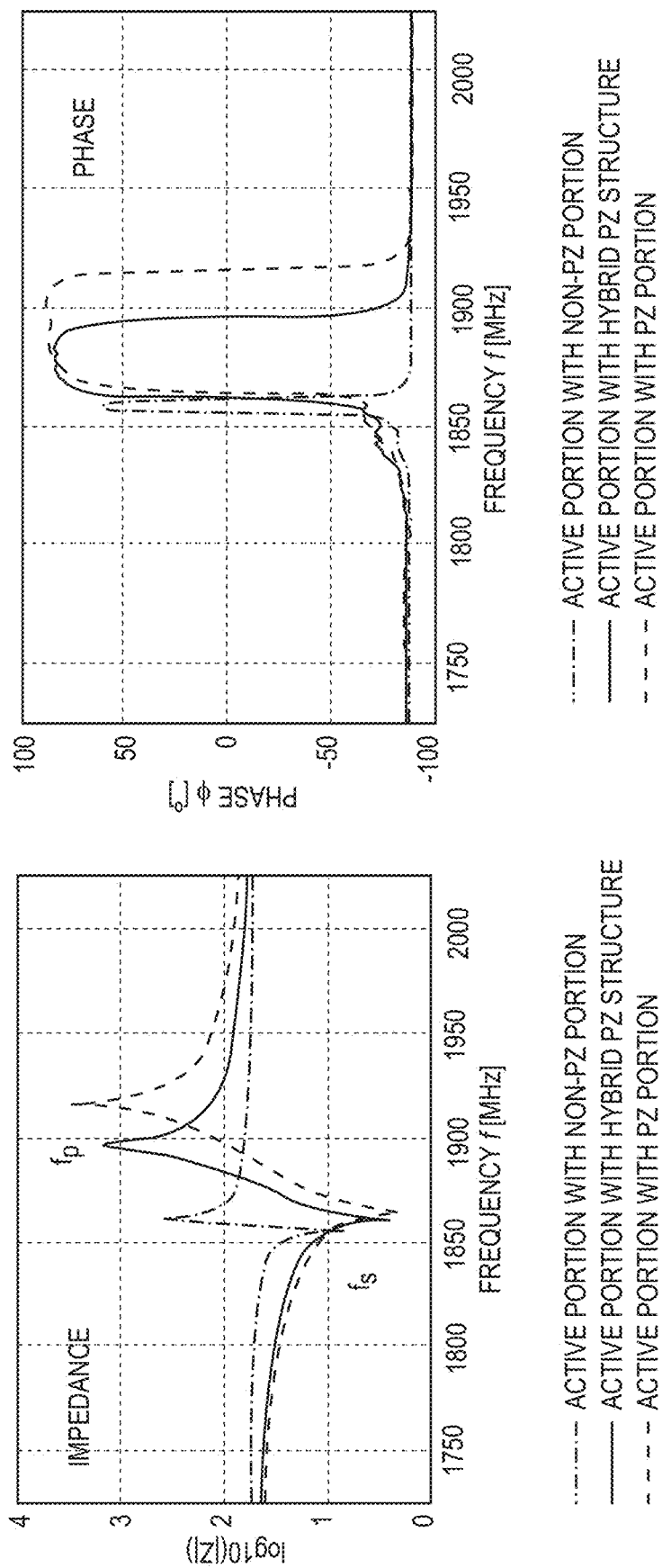
FIG. 11 is a graph of impedance magnitude over frequency for BAW resonators having different configuration for the piezoelectric layer.
FIG. 12 is a graph of phase over frequency for BAW resonators having different configuration for the piezoelectric layer.

FIGS. 11 and 12 illustrate the impact of providing a non-piezoelectric portion 40, a piezoelectric portion 38, or a hybrid piezoelectric structure 52 in the active portion SA of a piezoelectric layer 18 of a BAW resonator 10. The examples in FIGS. 11 and 12 below assume a 50/50 ratio for the pillars 44 and mesh 46 of non-piezoelectric portions 40. FIG. 11 is a graph of impedance magnitude versus frequency for a given BAW resonator 10 with the differently configured active portions SA. Notably, the spread between series and parallel resonance frequencies fs, fp directly corresponds to the electromechanical coupling factor k for the BAW resonator 10. As such, an active portion SA with a piezoelectric portion 38 has the greatest spread and affords the highest coupling factor k, which is 6.55% in this example. An active portion SA with a non-piezoelectric portion 40 has very little spread and affords the lowest coupling factor k of zero or near zero, which is 0.75% or less in this example. An active portion SA with a piezoelectric portion 38 has an intermediate spread and affords an intermediate electromechanical coupling factor k, which is 4.3% in this example and lower than that for an active portion SA with a piezoelectric portion 38. The electromechanical coupling factor k will vary based on the ratio of the thicknesses of the piezoelectric base layer 50 and the non-piezoelectric portion 40, which resides over the base layer 50 in the hybrid piezoelectric structure 52.

FIG. 12 is a graph of phase response versus frequency for the given BAW resonator 10. The band of the phase response also corresponds to the electromechanical coupling factor k for the BAW resonator 10. As such, an active portion SA with a piezoelectric portion 38 has a relatively wide band and affords the highest coupling factor k. An active portion SA with a non-piezoelectric portion 40 has a very narrow band and affords the lowest coupling factor k. An active portion SA with a piezoelectric portion 38 has an intermediate band and affords an intermediate electromechanical coupling factor k, which is lower than that for an active portion SA with a piezoelectric portion 38.

The following describes a process for forming a piezoelectric film 36, such as that illustrated in FIG. 7, which has both a piezoelectric portion 38 and a non-piezoelectric portion 40 over a foundation structure 34, which may represent a portion of a BAW resonator 10, such as the reflector 14 covered in part by a bottom electrode 22. For the purposes of this example, assume that the piezoelectric portion 38 is formed over at least part over a top surface of the bottom electrode 22 that corresponds to an active region 24. Further assume that the non-piezoelectric portion 40 is formed over at least a part the top surface of the reflector 14. Those skilled in the art will recognize numerous variants. For this example, the piezoelectric material used for the piezoelectric film 36 is the Group III-V compound of aluminum nitride (AlN), and the metal that is deposited for forming the metal islands 42 is aluminum (Al), which is the metal of the Group III-V compound (AlN). Other Group III-V compounds that can be used for the piezoelectric material include, but are not limited to, GaN, InN, BN, ScAlN, ErAlN, and MgHfAlN. The respective metals that would be used for forming the metal islands 42 include, but are not limited to, Al, Pt, Ru, AlSc, and Ti.

Figure 13:
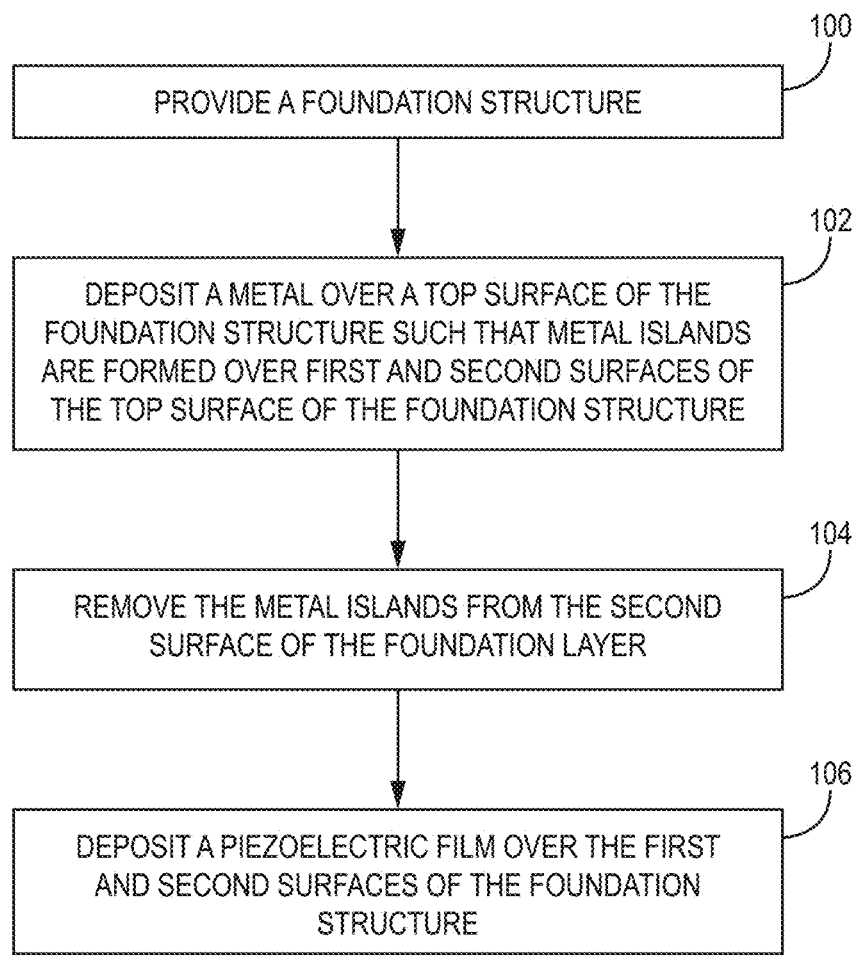
FIG. 13 is a method of fabricating a piezoelectric device according to one embodiment.
Figure 14:
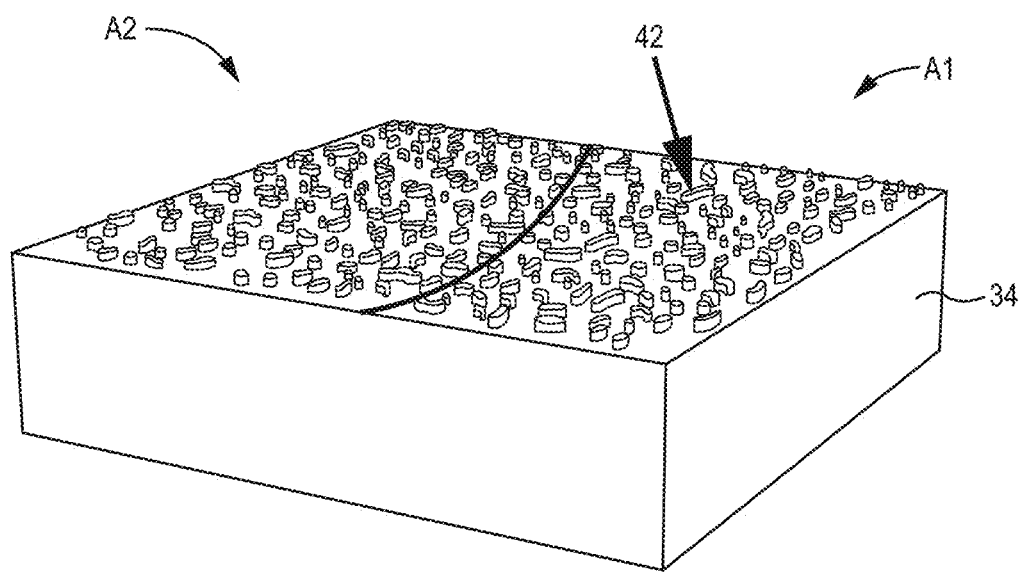
FIG. 14 illustrates metal islands distributed over a foundation structure according to one embodiment of the disclosure.
Figure 15:
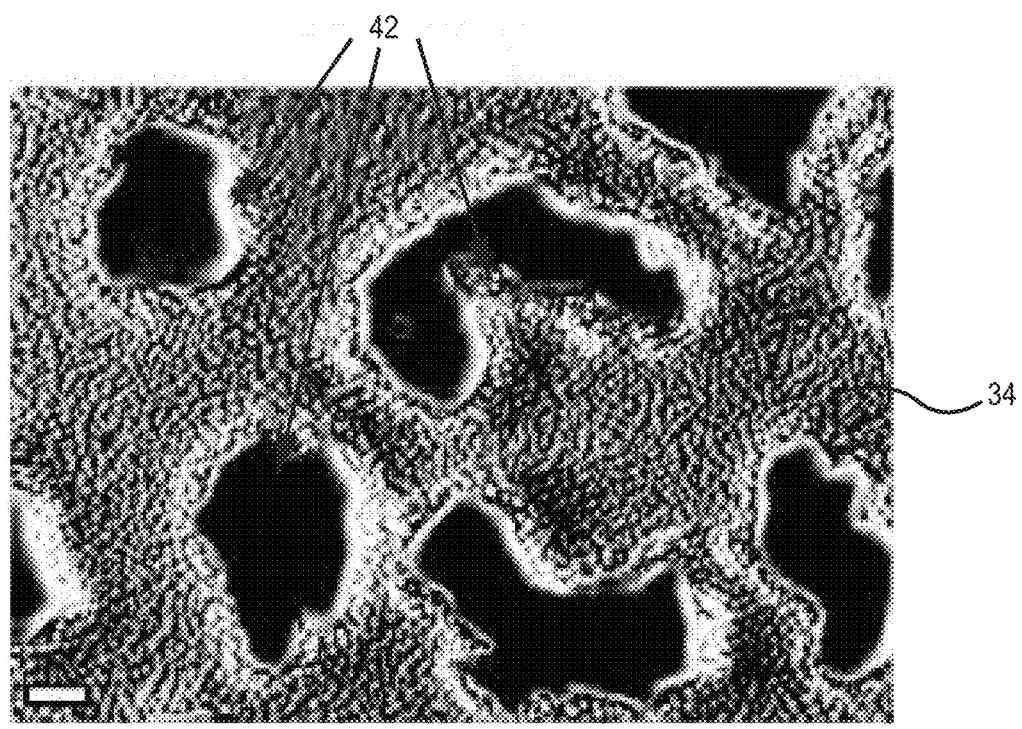
FIG. 15 is a scanning electron microscopy (SEM) photograph of the metal islands on the foundation structure prior to providing a piezoelectric film.

Turning now to FIG. 13, a foundation structure 34 with a top surface of a desired configuration is provided (Step 100). Next, a metal is deposited over first and second areas A1, A2 of the top surface of the foundation structure (Step 102). In one embodiment, the metal is deposited as a seed material directly on the top surface of the foundation structure 34 prior to deposition of any piezoelectric material. For this example, no base layer 50 is included. The metal is deposited in a manner wherein metal islands 42 self-assemble in a distributed manner over at least the first area A1 of the top surface of the foundation structure 34. FIG. 14 graphically illustrates the self-assembled metal islands 42 over the top surface of the foundation structure 34. Surface areas A1, A2 are illustrated wherein an imaginary border is shown separating the two surface areas A1, A2. FIG. 15 is a scanning electron microscopy (SEM) photograph providing a top view of the metal islands 42.

Figure 16:
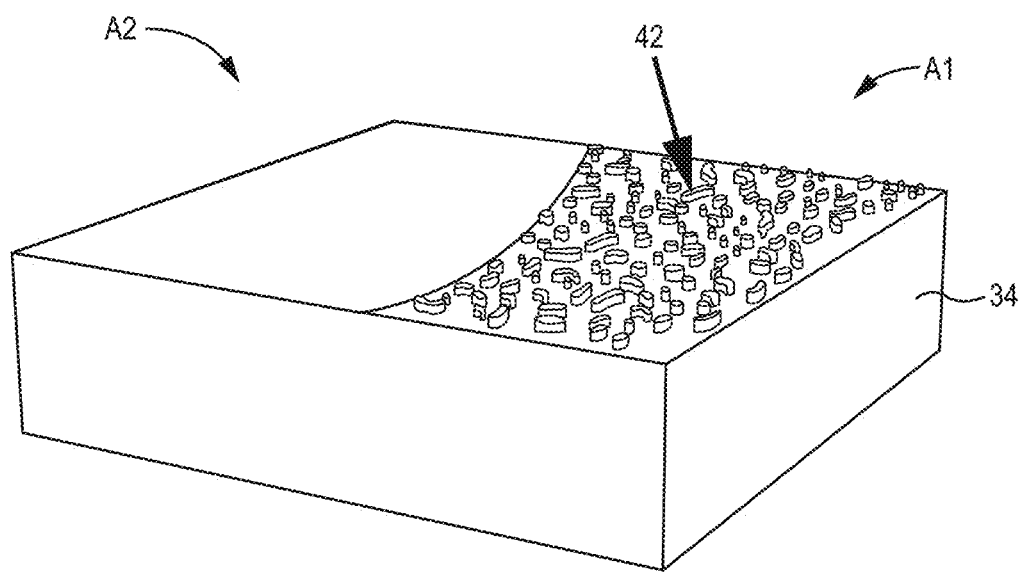
FIG. 16 illustrates the metal islands distributed over only a selected area of the foundation structure according to one embodiment of the disclosure.
Figure 17:
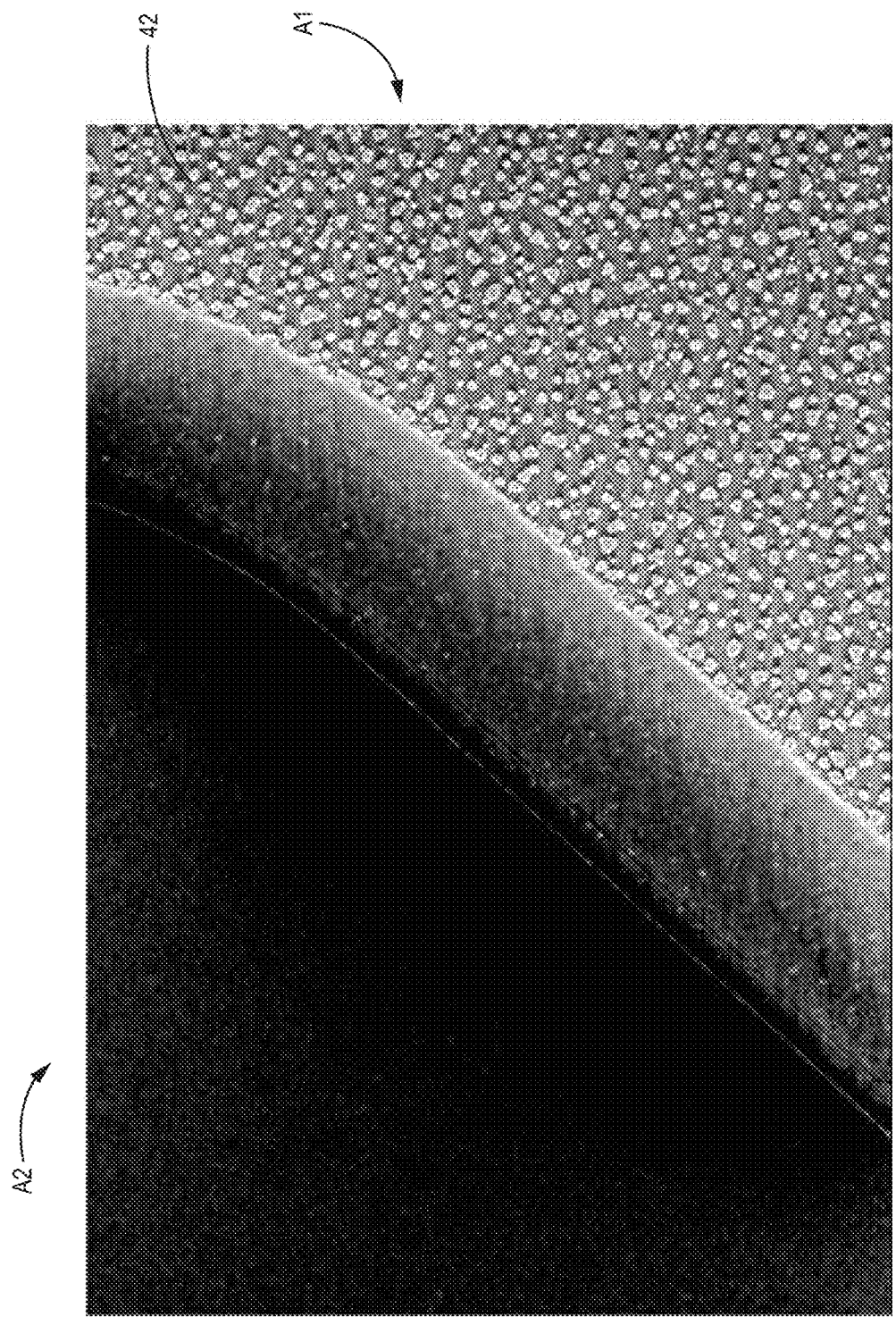
FIG. 17 is a scanning electron microscopy (SEM) photograph of the metal islands distributed over only a selected area of the foundation structure according to one embodiment of the disclosure.

When relying on self-assembly to form the metal islands 42, the metal is deposited at a sufficient level to avoid production of a continuous film and at temperature below the melting point of the metal. To aid in self-assembly of the metal islands 42, the aluminum may be deposited at a temperature that is less than one-third of the melting point of the aluminum. In one embodiment, the metal islands 42 are formed such that, on average, the metal islands 42 have a thickness of less than 20 nanometers and a largest width dimension of less than five micrometers. In another embodiment, the metal islands 42 are formed such that, on average, the metal islands 42 have a thickness of less than 50 nanometers and a largest width dimension of less than tens of micrometers (i.e. 10, 20, 30, or 40 micrometers). The metal islands 42 that were formed in the second area A2 are removed using an etching or like process (Step 104). The metal islands 42 in first area A1 remain. FIG. 16 graphically illustrates the foundation structure 34 after the metal islands 42 have been removed from the second area A2. FIG. 17 is an SEM photograph providing a top view of the same.

Figure 18:
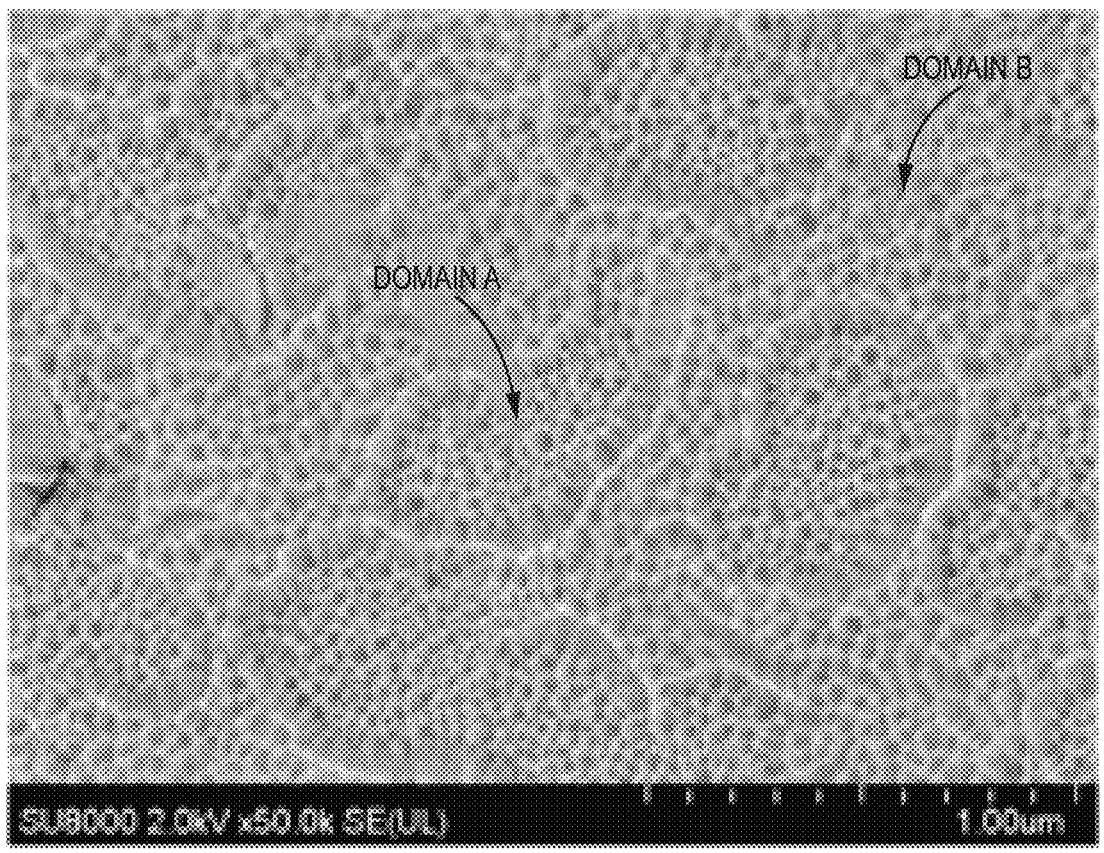
FIG. 18 is a scanning electron microscopy (SEM) photograph of the pillars and mesh of a non-piezoelectric portion of the piezoelectric film according to one embodiment of the disclosure.

After the metal islands 42 are removed from the second area A2, a piezoelectric film 36 is deposited over the first and second areas A1, A2 of the foundation structure (Step 106). The piezoelectric film 36 will cover the metal islands 42, which remain in the first area A1. Notably, the portion of the piezoelectric film 36 that is formed over the first area A1 is the non-piezoelectric portion 40, which is polarity patterned. As such, the non-piezoelectric portion 40 will include the pillars 44, which have a first polar orientation and form over corresponding ones of the remaining metal islands 42. The non-piezoelectric portion 40 will also include the mesh 46 that has a second polar orientation, which is opposite that of the first polar orientation, and surrounds the pillars 44 as well as the underlying metal islands 42. The SEM photograph of FIG. 18 is top view of the pillars 44 (Domain A) and the mesh (Domain B).

When the piezoelectric material is aluminum nitride, the polar orientation of the mesh 46, the base layer 50, and the piezoelectric portion 38 is illustrated in FIG. 19. In particular, the polar orientation is aluminum polar (Al-polar) and the growth direction is along the c-axis. For Al-polar atomic structure, the Al—N chemical bond along c-axis is such that Al atom faces down towards the base, while N atom faces up. The net polarity, Pnet, is inverted, as represented by the downward arrow. The polar orientation of the pillars 44 is reversed, as illustrated in FIG. 20. The polar orientation is nitrogen polar (N-polar) and the growth direction is along the c-axis. For N-polar atomic structure, the Al—N chemical bond along c-axis is such that N atom faces down towards the base, while Al atom faces up. The net polarity, Pnet, is aligned with the growth direction, as represented by the upward arrow. While aluminum nitride is used in this example, other piezoelectric compounds may be used for the piezoelectric material and an appropriate metal, such as the metal of the compound may be used to form the metal islands 42.

An alternative process is illustrated in FIG. 21 wherein the hybrid piezoelectric structure 52 of FIG. 8 is formed. Initially, the foundation structure 34 with a top surface of a desired configuration is provided (Step 200). Next, a base layer 50 of piezoelectric material is deposited over the top surface of the foundation structure 34 (Step 202). A metal is deposited over first and second areas A1, A2 of the top surface of the base layer (Step 204). The metal is deposited directly on the top surface of the base layer 50, as opposed to the top surface of the foundation structure 34, as described in the prior embodiment. The metal is deposited in a manner wherein metal islands 42 self-assemble in a distributed manner over at least the first area A1 of the top surface of the base layer 50.

The metal islands 42 that were formed in the second area A2 are removed using an etching or like process (Step 206). The metal islands 42 in first area A1 remain. After the metal islands 42 are removed from the second area A2, a piezoelectric film 36 is deposited over the first and second areas A1, A2 of the base layer 50 (Step 208). In one embodiment, the piezoelectric film 36 will cover the metal islands 42, which remain in the first area A1. The portion of the piezoelectric film 36 that is formed over the first area A1 is the non-piezoelectric portion 40, which is polarity patterned. As such, the non-piezoelectric portion 40 will include the pillars 44, which have a first polar orientation and reside over corresponding ones of the remaining metal islands 42. The non-piezoelectric portion 40 will also include the mesh 46 that has a second polar orientation, which is opposite that of the first polar orientation, and surrounds the pillars 44 as well as the underlying metal islands 42. The piezoelectric material of the base layer 50 will have the second polar orientation. While self-assembly of the metal islands 42 is described above, those skilled in the art will recognize other techniques for forming the metal islands 42, such as patterning metal using electron-beam lithography or photolithography.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
a foundation structure;
a plurality of metal islands distributed over a first area of a top surface of the foundation structure; and
a piezoelectric film over the foundation structure and formed from a piezoelectric material, wherein:
the piezoelectric film has at least one non-piezoelectric portion over the first area and at least one piezoelectric portion over a second area of the top surface of the foundation structure; and
within the at least one non-piezoelectric portion, the piezoelectric film is polarity patterned to comprise:
pillars of the piezoelectric material having a first polar orientation residing over corresponding ones of the plurality of metal islands; and
a mesh of the piezoelectric material having a second polar orientation, which is opposite that of the first polar orientation, and surrounding the pillars.

2. The device of claim 1 wherein the plurality of metal islands are self-assembled islands.

3. The device of claim 2 wherein the piezoelectric material is formed from a compound comprising a metal element and a non-metal element, and the self-assembled islands consist essentially of the metal element.

4. The device of claim 3 wherein the metal element is a group III element, and the non-metal element is a group V element.

5. The device of claim 2 wherein the piezoelectric material is formed from a compound comprising a metal element and a non-metal element, and the self-assembled islands are essentially void of the non-metal element.

6. The device of claim 3 wherein the metal element is a group III element, and the non-metal element is a group V element.

7. The device of claim 1 wherein the piezoelectric material is one of a group consisting of AN, ScAlN, GaN, InN, BN, ErAlN, MgHfAlN, MgZrAlN, and TiAlN, and the plurality of metal islands consist essentially of one of a group consisting of Al, ScAl, Pt, Ti, and Ru.

8. The device of claim 1 wherein within the at least one piezoelectric portion of the piezoelectric film, the piezoelectric material has the second polar orientation and is not polarity patterned.

9. The device of claim 1 further comprising a bottom electrode over the foundation structure and a top electrode over the bottom electrode, wherein the at least one piezoelectric portion is provided in an active region between the bottom electrode and the top electrode.

10. The device of claim 9 wherein the at least one non-piezoelectric portion is provided in an outside region at least partially surrounding the active region.

11. The device of claim 1 further comprising a base layer of the piezoelectric material between the at least one non-piezoelectric portion and the foundation structure, wherein the plurality of metal islands are over and directly on the base layer.

12. The device of claim 1 further comprising:
a bottom electrode over the foundation structure;
a base layer of the piezoelectric material over the bottom electrode and having the second polar orientation, wherein the plurality of metal islands are over the base layer; and
a top electrode over the at least one non-piezoelectric portion, wherein the at least one non-piezoelectric portion is over the base layer, and the at least one non-piezoelectric portion and the base layer are between the bottom electrode and the top electrode.

13. The device of claim 1 further comprising:
a first bottom electrode over the foundation structure;
a first top electrode over the first bottom electrode, wherein the at least one piezoelectric portion is between the first bottom electrode and the first top electrode;
a second bottom electrode over the foundation structure;
a base layer of the piezoelectric material over the second bottom electrode and having the second polar orientation, wherein the plurality of metal islands are on the base layer; and
a second top electrode over the base layer, wherein the at least one non-piezoelectric portion and the base layer are between the second bottom electrode and the second top electrode.

14. The device of claim 13 wherein:
the first bottom electrode and the first top electrode form part of a first transducer for a first bulk acoustic wave resonator; and
the second bottom electrode and the second top electrode form part of a second transducer for a second bulk acoustic wave resonator.

15. The device of claim 1 wherein the plurality of metal islands on average have a thickness of less than 20 nanometers and a largest width dimension of less than five micrometers.

16. The device of claim 1 wherein the plurality of metal islands on average have a largest width dimension of less than 30 micrometers.

17. The device of claim 1 wherein the piezoelectric material is one of aluminum nitride and scandium aluminum nitride and the plurality of metal islands are self-assembled and comprise aluminum.

18. A device comprising:
a foundation structure;
a plurality of metal islands distributed over a first area of a top surface of the foundation structure; and
a piezoelectric film over the foundation structure and formed from a piezoelectric material, wherein:
the piezoelectric film has at least one non-piezoelectric portion over the first area; and
within the at least one non-piezoelectric portion, the piezoelectric film is polarity patterned to comprise:
pillars of the piezoelectric material having a first polar orientation residing over corresponding ones of the plurality of metal islands; and
a mesh of the piezoelectric material having a second polar orientation, which is opposite that of the first polar orientation, and surrounding the pillars.

* * * * *

UNITED STATES PATENT AND TRADEMARK OFFICE
CERTIFICATE OF CORRECTION

PATENT NO. : 11,063,572 B2  
APPLICATION NO. : 15/843863  
DATED : July 13, 2021  
INVENTOR(S) : Jyothi Swaroop Sadhu and Maria Wang Page 1 of 1

It is certified that error appears in the above-identified patent and that said Letters Patent is hereby corrected as shown below:

In the Claims

Claim 7, Column 15, Line 41, replace "consisting of AN" with --consisting of AlN--.

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*